United States Patent
Cha (10) Patent No.: US 11,193,982 B2
(45) Date of Patent: Dec. 7, 2021

(54) BATTERY MANAGEMENT SYSTEM AND METHOD FOR OPTIMIZING INTERNAL RESISTANCE OF BATTERY

(71) Applicant: LG CHEM, LTD., Seoul (KR)

(72) Inventor: Sun-Young Cha, Daejeon (KR)

(73) Assignee: LG Chem, Ltd., Seoul (KR)

( * ) Notice: Subject to any disclaimer, the term of this patent is extended or adjusted under 35 U.S.C. 154(b) by 114 days.

(21) Appl. No.: 16/614,559

(22) PCT Filed: Nov. 15, 2018

(86) PCT No.: PCT/KR2018/014036
§ 371 (c)(1),
(2) Date: Nov. 18, 2019

(87) PCT Pub. No.: WO2019/135487
PCT Pub. Date: Jul. 11, 2019

(65) Prior Publication Data
US 2020/0088805 A1    Mar. 19, 2020

(30) Foreign Application Priority Data

Jan. 3, 2018  (KR) ......................... 10-2018-0000878

(51) Int. Cl.
*G01R 31/389* (2019.01)
*H01M 10/48* (2006.01)

(52) U.S. Cl.
CPC .......... *G01R 31/389* (2019.01); *H01M 10/48* (2013.01)

(58) Field of Classification Search
None
See application file for complete search history.

(56) References Cited

U.S. PATENT DOCUMENTS 6,522,102 B1   2/2003 Cheiky et al.
9,118,197 B2*  8/2015 Nagakura ............. H02J 7/0071
(Continued)

FOREIGN PATENT DOCUMENTS

EP    1 933 158 A1   6/2008
JP    2010-088167 A   4/2010
(Continued)

OTHER PUBLICATIONS

Scott, "Impact of High Fidelity Battery models for Vehicle Applications," 2015, University of Waterloo, CA (Year: 2015).*
(Continued)

*Primary Examiner* — Roy Y Yi
(74) *Attorney, Agent, or Firm* — Morgan, Lewis & Bockius LLP (57) ABSTRACT

A battery management system for optimizing the internal resistance of a battery includes a current measuring unit that measures a charge current of the battery, a memory that stores a plurality of voltage-current characteristic profiles, and a control unit that determines a reference profile from the plurality of voltage-current characteristic profiles based on a state of charge and temperature of the battery. The reference profile includes a start point, an end point, and a plurality of intermediate points disposed between the start point and the end point. The control unit determines an internal resistance of the battery, sets one of the plurality of intermediate points as a reference point, determines a reference resistance based on the reference point and the end point, and determines an optimal resistance based on the charge current, the internal resistance, the reference resistance and a predetermined upper limit of charge current.

18 Claims, 4 Drawing Sheets

(56) References Cited

U.S. PATENT DOCUMENTS

| | | |
|---|---|---|
| 2006/0087291 A1 | 4/2006 | Yamauchi |
| 2008/0204031 A1 | 8/2008 | Iwane et al. |
| 2010/0079111 A1 | 4/2010 | Masuda |
| 2012/0004875 A1 | 1/2012 | Maeda et al. |
| 2012/0098481 A1 | 4/2012 | Hunter et al. |
| 2012/0206111 A1 | 8/2012 | Park |
| 2013/0076314 A1 | 3/2013 | Nagakura |
| 2014/0103933 A1* | 4/2014 | Gibbs .................. B60L 58/12 324/427 |
| 2016/0233693 A1 | 8/2016 | Suzuki |
| 2016/0344068 A1 | 11/2016 | Kim et al. |
| 2017/0059662 A1 | 3/2017 | Cha et al. |
| 2017/0123011 A1 | 5/2017 | Cha et al. |

FOREIGN PATENT DOCUMENTS

| | | |
|---|---|---|
| JP | 2010-169609 A | 8/2010 |
| JP | 2010-203885 A | 9/2010 |
| JP | 2012-13554 A | 1/2012 |
| JP | 2015-119558 A | 6/2015 |
| KR | 10-2006-0052273 A | 5/2006 |
| KR | 10-2012-0091835 A | 8/2012 |
| KR | 10-2013-0016361 A | 2/2013 |
| KR | 10-2014-0025310 A | 3/2014 |
| KR | 10-2014-0123838 A | 10/2014 |
| KR | 10-2016-0039364 A | 4/2016 |
| KR | 10-2016-0094882 A | 8/2016 |
| KR | 10-2016-0103396 A | 9/2016 |
| KR | 10-2016-0136079 A | 11/2016 |
| WO | 2015/092986 A | 6/2015 |

OTHER PUBLICATIONS

Extended European Search Report dated Jul. 28, 2020, issued in corresponding European Patent Application No. 18898336.5.

International Search Report issued in corresponding International Patent Application No. PCT/KR2018/014036, dated Apr. 2, 2019.

Office Action dated Oct. 22, 2020, issued in corresponding Korean Patent Application No. 10-2018-0000878.

Office Action dated Nov. 4, 2020, issued in corresponding Japanese Patent Application No. 2019-562302.

\* cited by examiner

BATTERY MANAGEMENT SYSTEM AND METHOD FOR OPTIMIZING INTERNAL RESISTANCE OF BATTERY

TECHNICAL FIELD

The present disclosure relates to a battery management system and a method for optimizing an internal resistance of a battery when charging the battery.

The present application claims priority to Korean Patent Application No. 10-2018-0000878 filed in the Republic of Korea on Jan. 3, 2018, the disclosures of which are incorporated herein by reference.

BACKGROUND ART

Recently, there is dramatically growing demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages of free charging and discharging, a very low self-discharge rate and high energy density.

Because a battery reduces in life when overcharged, it is necessary to adaptively adjust the output power of the battery according to the state of the battery during the charge of the battery. To adjust the output power of the battery, the process of determining the internal resistance of the battery is required. To this end, conventional technology such as Patent Literature 1 records voltage data and current data indicating a voltage-current characteristic of the battery for a specific state of charge (SOC) and a specific temperature through experiments, and calculates the internal resistance corresponding to the specific SOC and the specific temperature by linearizing the voltage-current characteristic using a data fitting algorithm such as the least square method.

However, even in a situation in which the SOC and temperature of the battery is constant, the internal resistance of the battery may change depending on the magnitude of the charge current. Accordingly, the technology disclosed by Patent Literature 1 is difficult to effectively prevent the overcharge of the battery.

(Patent Literature 1) Korean Patent Publication No. 10-2006-0052273 (published on May 19, 2006)

DISCLOSURE

Technical Problem

The present disclosure is designed to solve the above-described problem, and therefore the present disclosure is directed to a providing a battery management system and a method for optimizing the internal resistance of a battery defined by a voltage-current characteristic profile corresponding to a specific state of charge and a specific temperature according to the charge current of the battery.

These and other objects and advantages of the present disclosure will be understood by the following description and will be apparent from the embodiments of the present disclosure. Further, it will be readily understood that the objects and advantages of the present disclosure can be realized by the means set forth in the appended claims and combinations thereof.

Technical Solution

Various embodiments of the present disclosure for achieving the above-described object are as follows.

A battery management system for optimizing an internal resistance of a battery according to an embodiment of the present disclosure includes a current measuring unit configured to measure a charge current of the battery, a memory configured to store a plurality of voltage-current characteristic profiles, and a control unit operably coupled to the current measuring unit and the memory, and configured to determine a reference profile from the plurality of voltage-current characteristic profiles based on a state of charge and temperature of the battery, the reference profile including a start point, an end point, and a plurality of intermediate points disposed between the start point and the end point. The control unit determines the internal resistance of the battery based on the start point and the end point. The control unit sets one of the plurality of intermediate points as a reference point. The control unit determines a reference resistance that is lower than the internal resistance based on the reference point and the end point. The control unit determines an optimal resistance that is larger than the internal resistance based on the charge current, the internal resistance, the reference resistance and a predetermined upper limit of charge current.

The control unit may determine the internal resistance by dividing a difference between a voltage of the start point and a voltage of the end point by a current of the end point. The voltage of the start point may indicate an open-circuit voltage of the battery corresponding to the state of charge and the temperature of the battery.

The current of the end point may be equal to the upper limit of charge current.

The control unit may determine the reference resistance based on the voltage of the reference point, the current of the reference point, the voltage of the end point and the current of the end point.

The control unit may determine the reference resistance using the following Equation 1:

$$R_{ref} = \frac{V_{end} - V_{ref}}{I_{end} - I_{ref}}$$

In Equation 1, $I_{ref}$ denotes the current of the reference point, $V_{ref}$ denotes the voltage of the reference point, $I_{end}$ denotes the current of the end point, $V_{end}$ denotes the voltage of the end point, and $R_{ref}$ denotes the reference resistance.

The control unit may determine the optimal resistance using the following Equation 2:

$$R_{opt} = \frac{\{V_{ocv} + (R_{int} - R_{ref})I_{end} + R_{ref}I_{chr}\} - V_{ocv}}{I_{chr}} = \frac{(R_{int} - R_{ref})I_{end}}{I_{chr}} + R_{ref}$$

In Equation 2, $R_{int}$ denotes the internal resistance, $I_{chr}$ denotes the charge current, and $R_{opt}$ denotes the optimal resistance.

The control unit may determine an intermediate point closest to the end point among the plurality of intermediate points as the reference point.

A battery pack according to another embodiment of the present disclosure includes the battery management system.

A method for optimizing an internal resistance of a battery according to still another embodiment of the present disclosure includes determining a reference profile from a plurality of voltage-current characteristic profiles based on a state of charge and temperature of the battery, the reference profile including a start point, an end point, and a plurality of intermediate points disposed between the start point and the end point, determining the internal resistance of the battery based on the start point and the end point, setting one of the plurality of intermediate points as a reference point, determining a reference resistance that is lower than the internal resistance based on the reference point and the end point, and determining an optimal resistance that is larger than the internal resistance based on the charge current, the internal resistance, the reference resistance and a predetermined upper limit of charge current of the battery.

Advantageous Effects

According to at least one of the embodiments of the present disclosure, it is possible to optimize the internal resistance of a battery defined by a voltage-current characteristic profile corresponding to a specific state of charge and a specific temperature according to the charge current of the battery.

According to at least one of the embodiments of the present disclosure, the optimized internal resistance is used to adjust the output power of the battery, thereby preventing the overcharge of the battery more effectively than conventional technology.

The effects of the present disclosure are not limited to the above-mentioned effects, and other effects not mentioned herein will be clearly understood by those skilled in the art from the appended claims.

BRIEF DESCRIPTION OF THE DRAWINGS

The accompanying drawings illustrate a preferred embodiment of the present disclosure, and together with the following detailed description of the present disclosure, serve to provide a further understanding of the technical aspects of the present disclosure, and thus the present disclosure should not be construed as limited to the drawings.

MODE FOR CARRYING OUT THE INVENTION

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could be made thereto at the time of filing the application.

Additionally, in describing the present disclosure, when it is deemed that a certain detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Unless the context clearly indicates otherwise, it will be understood that the term "comprises" or "includes" when used in this specification, specifies the presence of stated elements, but does not preclude the presence or addition of one or more other elements. Additionally, the term<control unit> as used herein refers to a processing unit of at least one function or operation, and this may be implemented by hardware or software alone or in combination.

In addition, throughout the specification, it will be further understood that when an element is referred to as being "connected to" another element, it can be directly connected to the other element or intervening elements may be present.

Figure 1:
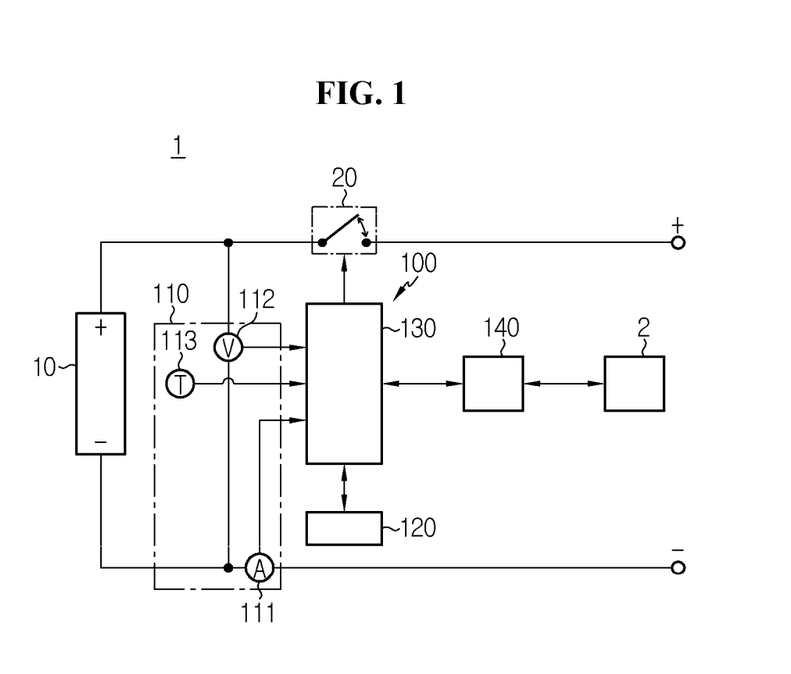
FIG. 1 is a diagram showing the functional configuration of a battery pack according to an embodiment of the present disclosure.

FIG. 1 is a diagram showing the functional configuration of a battery pack 1 according to an embodiment of the present disclosure.

Referring to FIG. 1, the battery pack 1 includes a battery 10, a switch 20 and a battery management system 100. The switch 20 is configured to adjust the magnitude of the charge current and/or the discharge current of the battery 10 in response to a switching signal (e.g., a pulse width modulation signal) from the battery management system 100. Hereinafter, assume that the discharge current is measured in a positive value, and the charge current is measured in a negative value.

The battery management system 100 is electrically coupled to the battery 10 and configured to monitor and control the state of the battery 10. The battery management system 100 includes a sensing unit 110, a memory 120, a control unit 130 and a communication interface 140.

The sensing unit 110 may include a current measuring unit 111. The current measuring unit 111 measures the current flowing through the battery 10 in a predetermined cycle, and transmits a current signal indicating the measured current to the control unit 130. The current during the discharge of the battery 10 may be referred to as 'discharge current', and the current during the charge of the battery 10 may be referred to as 'charge current'. The control unit 130 may convert the current signal in an analog form transmitted from the current measuring unit 111 to current data in a digital form.

The sensing unit 110 may further include a voltage measuring unit 112. The voltage measuring unit 112 measures the terminal voltage of the battery 10 in a predetermined cycle, and transmits a voltage signal indicating the measured terminal voltage to the control unit 130. The control unit 130 may convert the voltage signal in an analog form transmitted from the voltage measuring unit 112 to voltage data in a digital form.

The sensing unit 110 may further include a temperature measuring unit 113. The temperature measuring unit 113 measures the temperature of the battery 10 in a predetermined cycle, and transmits a temperature signal indicating the measured temperature to the control unit 130. The control unit 130 may convert the temperature signal in an analog form transmitted from the temperature measuring unit 113 to temperature data in a digital form. The current measuring unit 111, the voltage measuring unit 112 and the temperature measuring unit 113 may operate in time synchronization with each other.

The memory 120 is configured to store a plurality of voltage-current characteristic profiles. Each voltage-current characteristic profile includes a start point, an end point and a plurality of intermediate points. The start point indicates an open-circuit voltage (OCV) measured when the charge current is 0 A. The end point indicates voltage measured when pulse charging with a constant current that is equal to a preset upper limit of charge current. Each intermediate point indicates voltage of the battery 10 measured when pulse charging the battery 10 with a constant current that is larger than 0 A and lower than the upper limit of charge current.

Each voltage-current characteristic profile may be associated with a specific state of charge (SOC) and a specific temperature. For example, one of the plurality of voltage-current characteristic profiles may be associated with 80% SOC and temperature of −20° C., and the other may be associated with 80% SOC and temperature of 25° C. Of course, a variety of voltage-current characteristic profiles associated with other SOCs and temperatures may be stored in the memory 120.

The memory 120 may additionally store data, instructions and software required for the entire operation of the battery management system 100. The memory 120 may include at least one type of storing medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) and programmable read-only memory (PROM).

The control unit 130 is operably coupled to the sensing unit 110, the memory 120 and the communication interface 140. The control unit 130 may estimate an SOC of the battery 10 based on the current signal, the voltage signal and/or the temperature signal transmitted from the sensing unit 110. The control unit 130 may update the SOC of the battery 10 in a predetermined cycle based on the current signal using ampere counting. Alternatively, the control unit 130 may update the SOC of the battery 10 in a predetermined cycle using a method widely known in the art other than ampere counting, such as the extended Kalman filter.

The control unit 130 may determine the temperature of the battery 10 based on the temperature signal transmitted from the sensing unit 110, and determine a reference profile from the plurality of voltage-current characteristic profiles based on the estimated SOC and the determined temperature. The reference profile may be one of the plurality of voltage-current characteristic profiles corresponding to the estimated SOC and the determined temperature.

The control unit 130 may be physically implemented using at least one of application specific integrated circuits (ASICs), digital signal processors (DSPs), digital signal processing devices (DSPDs), programmable logic devices (PLDs), field programmable gate arrays (FPGAs), microprocessors and electrical units for performing other functions.

The communication interface 140 may be coupled to an external device 2 such as an ECU of an electric vehicle to enable communication therebetween. The communication interface 140 may receive a command message from the external device 2, and provide the received command message to the control unit 130. The command message may be a message that requires the activation of a specific function of the device. The communication interface 140 may transmit a notification message from the control unit 130 to the external device 2. The notification message may be a message for notifying the result of a function performed by the control unit 130 to the external device 2.

Figure 2:
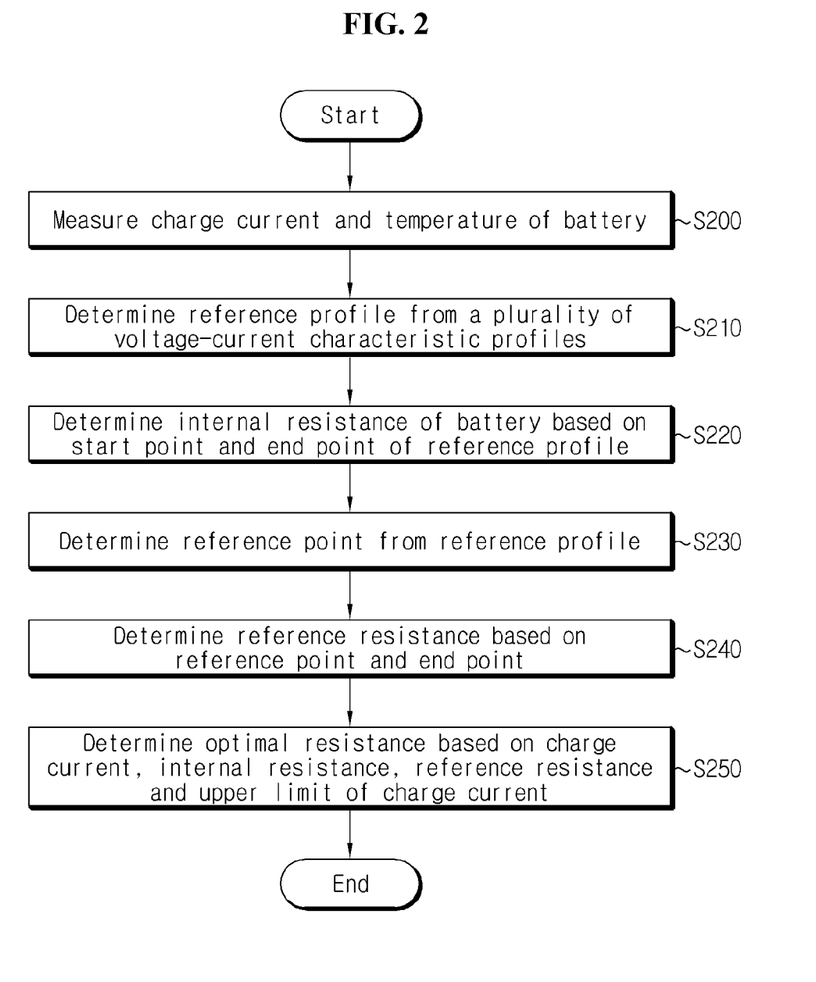
FIG. 2 is a flowchart showing a method for optimizing the internal resistance of a battery according to another embodiment of the present disclosure.
Figure 3:
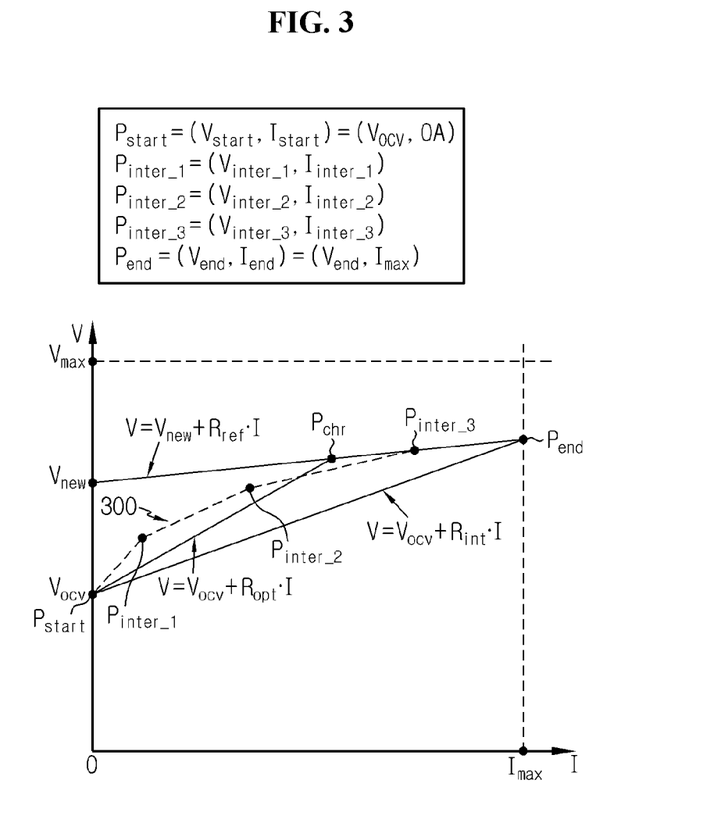
FIG. 3 is a graph showing an exemplary voltage-current characteristic profile for reference in describing the method of FIG. 2.

FIG. 2 is a flowchart showing a method for optimizing the internal resistance of the battery 10 according to another embodiment of the present disclosure, and FIG. 3 is a graph showing an exemplary voltage-current characteristic profile for reference in describing the method of FIG. 2.

Referring to FIG. 2, in step S200, the control unit 130 measures the charge current $I_{chr}$ and temperature of the battery 10 using the sensing unit 110.

In step S210, the control unit 130 determines a reference profile from the plurality of voltage-current characteristic profiles stored in the memory 120 based on the SOC (e.g., 80% SOC) and the measured temperature (e.g., 25° C.) of the battery 10. In other words, the reference profile determined through the step S210 is one of the plurality of voltage-current characteristic profiles corresponding to the SOC (e.g., 80% SOC) and temperature (e.g., 25° C.) of the battery 10. To determine the reference profile, the control unit 130 may update each of the SOC and temperature of the battery 10 to a latest value based on the current signal, the voltage signal and/or the temperature signal from the sensing unit 110 before performing the step S210.

The voltage-current characteristic profile 300 shown in FIG. 3 exemplifies the reference profile determined by the step S210, and may be one associated with 80% SOC and temperature of 25° C. among the plurality of voltage-current characteristic profiles 300 stored in the memory 120.

Assume that the voltage-current characteristic profile 300 includes a total of five points, i.e., a start point $P_{start}$, intermediate points $P_{inter\_1}$, $P_{inter\_2}$, $P_{inter\_3}$ and an end point $P_{end}$. The three intermediate points $P_{inter\_1}$, $P_{inter\_2}$, $P_{inter\_3}$ are disposed between the start point $P_{start}$ and the end point $P_{end}$ as described above.

In the condition in which each of SOC and temperature of other battery fabricated with the same electrical and chemical properties as the battery 10 is uniformly maintained at a specific value, the voltage-current characteristic profile 300 may be defined by the terminal voltage $V_{start}$, $V_{inter\_1}$, $V_{inter\_2}$, $V_{inter\_3}$, $V_{end}$ of the other battery measured at the time of pulse charging the other battery with different magnitudes of constant currents $I_{start}$, $I_{inter\_1}$, $I_{inter\_2}$, $I_{inter\_3}$, $I_{end}$ repeatedly for a predetermined time (e.g., 10 sec). For example, $V_{inter\_1}$ is voltage measured when charging the other battery with $I_{inter\_1}$ for 10 seconds in the condition in which the SOC and the temperature of the other battery are 80% and 25° C. $V_{inter\_2}$ is voltage measured when charging the other battery with $I_{inter\_2}$ for 10 seconds in the condition in which the SOC and the temperature of the other battery are 80% and 25° C. $V_{inter\_3}$ is voltage measured when charging the other battery with $I_{inter\_3}$ for 10 seconds in the condition in which the SOC and the temperature of the other battery are 80% and 25° C. and $V_{end}$ is voltage measured when charging the other battery with $I_{end}$ for 10 seconds in the condition in which the SOC and the temperature of the other battery are 80% and 25° C.

Of course, dissimilar to FIG. 3, the voltage-current characteristic profile 300 may include only one or two intermediate points or four or more intermediate points.

Each point that defines the voltage-current characteristic profile 300 is expressed as a voltage-current pair. In detail, the start point $P_{start}=(V_{start}, I_{start})$, the end point $P_{end}=(V_{end}, I_{end})$, the intermediate point $P_{inter\_1}=(V_{inter\_1}, I_{inter\_1})$, the intermediate point $P_{inter\_2}=(V_{inter\_2}, I_{inter\_2})$, and the intermediate point $P_{inter\_3}=(V_{inter\_3}, I_{inter\_3})$. $V_{start}$ is the terminal voltage detected when the charge current is $I_{start}$, $V_{inter\_1}$ is the terminal voltage detected when the charge current is $I_{inter\_1}$, $V_{inter\_2}$ is the terminal voltage detected when the charge current is $I_{inter\_2}$, $V_{inter\_3}$ is the terminal voltage detected when the charge current is $I_{inter\_3}$, and $V_{end}$ is the terminal voltage detected when the charge current is $I_{end}$.

$V_{ocv}=V_{start}<V_{inter\_1}<V_{inter\_2}<V_{inter\_3}<V_{end}$, and $I_{start}<I_{inter\_1}<I_{inter\_2}<I_{inter\_3}<I_{end}=I_{max}$. $V_{ocv}$ denotes the OCV of the battery 10 at SOC 80% and temperature of 25° C. $I_{max}$ denotes the upper limit of charge current, and may be a value given to prevent the battery 10 from being damaged by overcurrent. $V_{end}$ may be equal to a preset upper limit of charge voltage $V_{max}$. The control unit 130 may control the charge current of the battery 10 to prevent the current exceeding the upper limit of charge current $I_{max}$ from flowing through the battery 10.

In step S220, the control unit 130 determines the internal resistance $R_{int}$ of the battery 10 based on the start point $P_{start}$ and the end point $P_{end}$. In detail, a straight line passing through the start point $P_{start}$ and the end point $P_{end}$ may be represented by the following Equation 1.

$$V=V_{ocv}+R_{int}I \qquad \text{<Equation 1>}$$

The internal resistance $R_{int}$ is the solution of simultaneous equations obtained by substituting the voltage and current of each of the start point $P_{start}$ and the end point $P_{end}$ into V and I of Equation 1, and the control unit 130 may determine the internal resistance $R_{int}$ using the following Equation 2.

$$R_{int} = \frac{V_{end} - V_{start}}{I_{end} - I_{start}} \qquad \text{<Equation 2>}$$

Alternatively, the internal resistance $R_{int}$ may be a value pre-stored in the memory 120 for the voltage-current characteristic profile 300, and in this case, the control unit 130 may read the internal resistance $R_{int}$ from the memory 120 instead of performing the step S220.

In step S230, the control unit 130 determines a reference point $P_{ref}$ from the reference profile 300. The reference point $P_{ref}$ is one of the intermediate points $P_{inter\_1}$, $P_{inter\_2}$, $P_{inter\_3}$ included in the voltage-current characteristic profile 300. When k=1, 2, 3, the control unit 130 may calculate the slope $G_k$ of a straight line passing through the intermediate point $P_{inter\_k}$ and the end point $P_{end}$ using the following Equation 3.

$$G_k = \frac{V_{end} - V_{inter\_k}}{I_{end} - I_{inter\_k}} \qquad \text{<Equation 3>}$$

The control unit 130 may set one intermediate point where the calculated slope of the straight line is smallest as the reference point. For example, when $G_1>G_2>G_3$ as shown in the voltage-current characteristic profile 300 of FIG. 3, the control unit 130 may set $P_{inter\_3}$ as the reference point $P_{ref}$.

Alternatively, the control unit 130 may set the intermediate point $P_{inter\_3}$ closest to the end point $P_{end}$ among the intermediate points $P_{inter\_1}$, $P_{inter\_2}$, $P_{inter\_3}$ as the reference point $P_{ref}$.

In step S240, the control unit 130 determines a reference resistance $R_{ref}$ that is lower than the internal resistance $R_{int}$ based on the reference point $P_{ref}$ and the end point $P_{end}$.

In detail, a straight line passing through the reference point $P_{ref}$ and the end point $P_{end}$ may be represented by the following Equation 4.

$$V=V_{new}+R_{ref}I \qquad \text{<Equation 4>}$$

In Equation 4, $V_{new}$ is voltage of a point at which a straight line of the same slope as $R_{ref}$ passing through the reference point $P_{ref}$ meets the V axis as shown in FIG. 3.

The $V_{new}$ and the reference resistance $R_{ref}$ are two solutions of the simultaneous equations obtained by substituting the voltage and current of each of the reference point $P_{ref}$ and the end point $P_{end}$ into V and I of Equation 4, and the control unit 130 may determine the reference resistance $R_{ref}$ using the following Equation 5.

$$R_{ref} = \frac{V_{end} - V_{ref}}{I_{end} - I_{ref}} \qquad \text{<Equation 5>}$$

As in the above example, when the reference point $P_{ref}$ is the intermediate point $P_{inter\_3}$, $V_{ref}=V_{inter\_3}$ and $I_{ref}=I_{inter\_3}$ in Equation 5.

Alternatively, the reference resistance $R_{ref}$ may be a value pre-stored in the memory 120 for the voltage-current characteristics profile 300, and in this case, the control unit 130 may read the reference resistance $R_{ref}$ from the memory 120 instead of performing the steps S230 and S240.

Referring to FIG. 3, because the intermediate points $P_{inter\_1}$, $P_{inter\_2}$, $P_{inter\_3}$ are disposed above the straight line passing through the start point $P_{start}$ and the end point $P_{end}$, those skilled in the art will easily understand that the reference resistance $R_{ref}$ is lower than the internal resistance $R_{int}$.

In step S250, the control unit 130 determines an optimal resistance $R_{opt}$ based on the measured charge current $I_{chr}$, the internal resistance $R_{int}$, the reference resistance $R_{ref}$ and the upper limit of charge current $I_{max}$. In this instance, the optimal resistance $R_{opt}$ is larger than the internal resistance $R_{int}$. When the optimal resistance $R_{opt}$ determined by the step S250 is equal to or lower than the internal resistance $R_{int}$, the control unit 130 may determine that an error occurred during the execution of at least one of the steps S200~S250, and return to the step S210.

When the voltage $V_{end}$ and the current $I_{end}$ of the end point $P_{end}$ is respectively substituted into V and I of Equation 1, the following Equation 6 may be given.

$$V_{end}=V_{ocv}+R_{int}I_{end} \qquad \text{<Equation 6>}$$

When the voltage $V_{end}$ and the current $I_{end}$ of the end point $P_{end}$ is respectively substituted into V and I of Equation 4, the following Equation 7 may be given.

$$V_{end}=V_{new}+R_{ref}I_{end} \qquad \text{<Equation 7>}$$

Rewriting Equation 7 for $V_{new}$, the following Equation 8 may be given.

$$V_{new}=V_{end}-R_{ref}I_{end} \qquad \text{<Equation 8>}$$

When the right side of Equation 6, $V_{ocv}+I_{end}R_{int}$, is substituted into $V_{end}$ of Equation 8, the following Equation 9 may be given.

$$V_{new}=(V_{ocv}+R_{int}I_{end})-R_{ref}I_{end}=V_{ocv}+(R_{int}-R_{ref})I_{end} \quad <\text{Equation 9}>$$

In FIG. 3, $P_{chr}$ is a charge point disposed on the straight line passing through the reference point $P_{ref}$ and the end point $P_{end}$. The current of the charge point $P_{chr}$ is the charge current $I_{chr}$. Accordingly, the voltage $V_{chr}$ of the charge point $P_{chr}$ may be represented by the following Equation 10 from Equation 4.

$$V_{chr}=V_{new}+R_{ref}I_{chr} \quad <\text{Equation 10}>$$

When the right side of Equation 9, $V_{ocv}+(R_{int}-R_{ref})I_{end}$, is substituted into $V_{new}$ of Equation 10, the following Equation 11 may be given.

$$V_{chr}=V_{ocv}+(R_{int}-R_{ref})I_{end}+R_{ref}I_{chr} \quad <\text{Equation 11}>$$

The straight line passing through the start point $P_{start}$ and the charge point $P_{chr}$ may be represented by the following Equation 12.

$$V=V_{ocv}+R_{opt}I \quad <\text{Equation 12}>$$

The optimal resistance $R_{opt}$ indicates the slope of a straight passing through the start point $P_{start}$ and the charge point $P_{chr}$. When the voltage $V_{chr}$ and the current $I_{chr}$ of the charge point $P_{chr}$ are substituted into V and I of Equation 12 as below, Equation 13 may be given.

$$R_{opt} = \frac{V_{chr} - V_{ocv}}{I_{chr}} \quad <\text{Equation 13}>$$

When the right side of Equation 11, $V_{ocv}+(R_{int}-R_{ref})I_{end}$ $R_{ref}I_{chr}$, is substituted into $V_{chr}$ of Equation 13, the following Equation 14 may be given.

$$R_{opt} = \frac{\{V_{ocv} + (R_{int} - R_{ref})I_{end} + R_{ref}I_{chr}\} - V_{ocv}}{I_{chr}} = \frac{(R_{int} - R_{ref})I_{end}}{I_{chr}} + R_{ref} \quad <\text{Equation 14}>$$

The control unit 130 may determine the optimal resistance $R_{opt}$ using Equation 14. That is, the control unit 130 may determine the optimal resistance $R_{opt}$ by substituting $R_{int}$, $R_{ref}$, $I_{chr}$ and $I_{end}$ obtained through the steps S210 to S240 into Equation 14.

As described above, as $R_{int}$ is larger than $R_{ref}$, $R_{opt}$ is larger than $R_{int}$. Accordingly, controlling the output power using $R_{opt}$ during the charge of the battery 10 can prevent the overcharge of the battery 10 more effectively than controlling the output power using $R_{int}$ during the charge of the battery 10.

Figure 4:
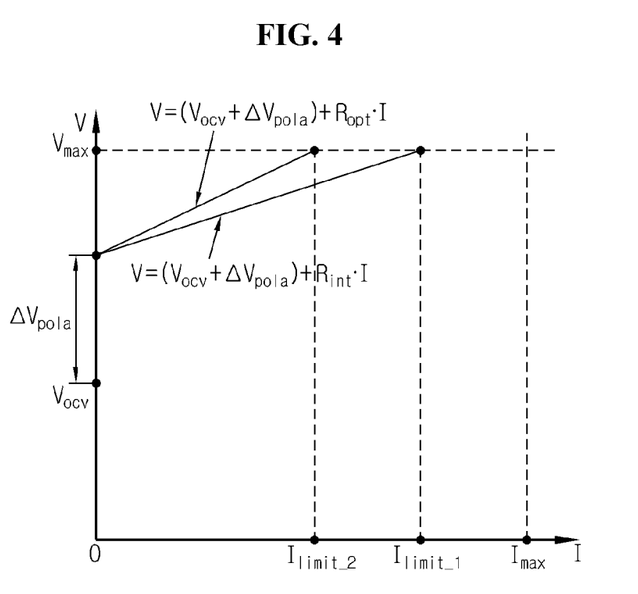
FIG. 4 is a graph for reference in describing a difference between a limited charge current determined based on the internal resistance and a limited charge current determined based on the optimal resistance as described above with reference to FIGS. 2 and 3.

FIG. 4 is a graph for reference in describing a difference between a limited charge current determined based on the internal resistance and a limited charge current determined based on the optimal resistance as described above with reference to FIGS. 2 and 3.

Referring to FIG. 4, the battery 10 may have a polarization voltage $\Delta V_{pola}$ at the time when the charge current $Li_{chr}$ is measured according to the state of use of the battery 10. For example, the polarization voltage $\Delta V_{pola}$ may be larger than 0V. The control unit 130 may determine the polarization voltage $\Delta V_{pola}$ reflected on the terminal voltage of the battery 10 using a known data fitting method such as the least square algorithm.

When the polarization voltage $\Delta V_{pola}$ happens, the voltage-current characteristic profile 300 shown in FIG. 3 may be modified such that it is shifted by $\Delta V_{pola}$ along the V axis as shown in FIG. 4. Accordingly, the start point $P_{start}$ is shifted to $P_{start\_pola}$, and the end point $P_{end}$ is shifted to $P_{end\_pola}$. In this instance, $P_{start\_pola}=(V_{OCV}+\Delta V_{pola}, 0)$, and $P_{end\_pola}=(V_{end}+\Delta V_{pola}, I_{max})$. Although not shown, the intermediate points $P_{inter\_1}$, $P_{inter\_2}$, $P_{inter\_3}$ of FIG. 3 are also shifted by $\Delta V_{pola}$ along the V axis.

To reflect the polarization voltage $\Delta V_{pola}$, Equation 1 may be changed to the following Equation 15, and Equation 12 may be changed to the following Equation 16.

$$V=(V_{ocv}+\Delta V_{pola})+R_{int}I \quad <\text{Equation 15}>$$

$$V=(V_{OCV}+\Delta V_{pola})+R_{opt}I \quad <\text{Equation 16}>$$

To prevent the battery 10 from being overcharged, it is desirable to determine a limited charge current for the battery 10, considering the polarization voltage $\Delta V_{pola}$.

The limited charge current $I_{limit\_1}$ based on the internal resistance $R_{int}$ may be determined using the following Equation 17 related to Equation 15.

$$I_{limit\_1} = \frac{V_{max} - (V_{ocv} + \Delta V_{pola})}{R_{int}} \quad <\text{Equation 17}>$$

In contrast, the control unit 130 may determine a limited charge current based on the optimal resistance $R_{opt}$ using the following Equation 18 related to Equation 16.

$$I_{limit\_2} = \frac{V_{max} - (V_{ocv} + \Delta V_{pola})}{R_{opt}} \quad <\text{Equation 18}>$$

As $R_{opt}$ is larger than $R_{int}$, $I_{limit\_2}$ is lower than $I_{limit\_1}$. Accordingly, when instead of $I_{limit\_1}$, $I_{limit\_2}$ is determined as the limited charge current of the battery 10, an increment amount of the terminal voltage of the battery 10 reduces by an amount corresponding to ($I_{limit\_1}-I_{limit\_2}$), thereby effectively preventing the battery 10 from being overcharged.

The control unit 130 may adjust the duty cycle of the switching signal outputted to the switch 20 to prevent the flow of the charge current exceeding the determined limited charge current $I_{limit\_2}$.

The embodiments of the present disclosure described hereinabove are not implemented only through the apparatus and method, and may be implemented through programs that realize the functions corresponding to the configurations of the embodiments of the present disclosure or recording media having the programs recorded thereon, and this implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

DESCRIPTION OF REFERENCE NUMERALS

1: battery pack
10: battery
20: switch
100: battery management system
110: sensing unit
120: memory
130: control unit
140: communication interface

What is claimed is:

1. A battery management system for optimizing an internal resistance of a battery, the battery management system comprising:
    a current measuring unit configured to measure a charge current of the battery;
    a memory storing a plurality of predetermined voltage-current characteristic profiles, each of the plurality of predetermined voltage-current characteristic profiles including a respective start point, an end point, and a plurality of intermediate points disposed between the start point and the end point; and
    a control unit operably coupled to the current measuring unit and the memory, the control unit being configured to:
        select a reference profile from among the plurality of predetermined voltage-current characteristic profiles based on a state of charge and a temperature of the battery;
        determine the internal resistance of the battery based on the start point and the end point;
        set one of the plurality of intermediate points as a reference point;
        determine a reference resistance that is lower than the internal resistance based on the reference point and the end point; and
        determine an optimal resistance that is larger than the internal resistance based on the charge current, the internal resistance, the reference resistance, and a predetermined upper limit of charge current.

2. The battery management system according to claim 1, wherein:
    the control unit is further configured to determine the internal resistance by dividing a difference between a voltage of the start point and a voltage of the end point by a current of the end point; and
    the voltage of the start point indicates an open-circuit voltage of the battery corresponding to the state of charge and the temperature of the battery.

3. The battery management system according to claim 2, wherein the current of the end point is equal to the upper limit of charge current.

4. The battery management system according to claim 1, wherein the control unit is further configured to determine the reference resistance based on the voltage of the reference point, the current of the reference point, the voltage of the end point, and the current of the end point.

5. The battery management system according to claim 4, wherein the control unit is further configured to determine the reference resistance using the following Equation 1, where:
    $I_{ref}$ denotes the current of the reference point,
    $V_{ref}$ denotes the voltage of the reference point,
    $I_{end}$ denotes the current of the end point,
    $V_{end}$ denotes the voltage of the end point, and
    $R_{ref}$ denotes the reference resistance:

$$R_{ref} = \frac{V_{end} - V_{ref}}{I_{end} - I_{ref}}. \quad \text{[Equation 1]}$$

6. The battery management system according to claim 5, wherein the control unit is further configured to determine the optimal resistance using the following Equation 2, where:
    $R_{int}$ denotes the internal resistance,
    $I_{chr}$ denotes the charge current, and
    $R_{opt}$ denotes the optimal resistance:

$$R_{opt} = \frac{\{V_{ocv} + (R_{int} - R_{ref})I_{end} + R_{ref}I_{chr}\} - V_{ocv}}{I_{chr}} = \quad \text{[Equation 2]}$$
$$\frac{(R_{int} - R_{ref})I_{end}}{I_{chr}} + R_{ref}.$$

7. The battery management system according to claim 1, wherein the control unit is further configured to determine an intermediate point closest to the end point among the plurality of intermediate points as the reference point.

8. A battery pack comprising the battery management system according to claim 1.

9. A method for optimizing an internal resistance of a battery, the method comprising:
    selecting a reference profile from among a plurality of predetermined voltage-current characteristic profiles based on a state of charge and temperature of the battery, each of the plurality of predetermined voltage-current characteristic profiles the reference profiles including a start point, an end point, and a plurality of intermediate points disposed between the start point and the end point;
    determining the internal resistance of the battery based on the start point and the end point;
    setting one of the plurality of intermediate points as a reference point;
    determining a reference resistance that is lower than the internal resistance based on the reference point and the end point; and
    determining an optimal resistance that is larger than the internal resistance based on the charge current, the internal resistance, the reference resistance, and a predetermined upper limit of charge current of the battery.

10. A battery management system for optimizing an internal resistance of a battery, the battery management system comprising:
    a current measuring unit configured to measure a charge current of the battery;
    a memory storing a plurality of voltage-current characteristic profiles, each of the plurality of voltage-current characteristic profiles including a respective start point, an end point, and a plurality of intermediate points disposed between the start point and the end point; and
    a control unit operably coupled to the current measuring unit and the memory, the control unit being configured to:
        select a reference profile from among the plurality of voltage-current characteristic profiles based on a state of charge and a temperature of the battery, wherein the intermediate points of the reference profile are disposed above a straight line passing through the start point and the end point;

determine the internal resistance of the battery based on the start point and the end point;

set one of the plurality of intermediate points as a reference point;

determine a reference resistance that is lower than the internal resistance based on the reference point and the end point; and determine an optimal resistance that is larger than the internal resistance based on the charge current, the internal resistance, the reference resistance, and a upper limit of charge current.

11. The battery management system according to claim 10, wherein:

the control unit is further configured to determine the internal resistance by dividing a difference between a voltage of the start point and a voltage of the end point by a current of the end point; and the voltage of the start point indicates an open-circuit voltage of the battery corresponding to the state of charge and the temperature of the battery.

12. The battery management system according to claim 11, wherein the current of the end point is equal to the upper limit of charge current.

13. The battery management system according to claim 10, wherein the control unit is further configured to determine the reference resistance based on the voltage of the reference point, the current of the reference point, the voltage of the end point, and the current of the end point.

14. The battery management system according to claim 13, wherein the control unit is further configured to determine the reference resistance using the following Equation 1, where:

$I_{ref}$ denotes the current of the reference point,
$V_{ref}$ denotes the voltage of the reference point,
$I_{end}$ denotes the current of the end point,
$V_{end}$ denotes the voltage of the end point, and
$R_{ref}$ denotes the reference resistance:

$$R_{ref} = \frac{V_{end} - V_{ref}}{I_{end} - I_{ref}}. \quad \text{[Equation 1]}$$

15. The battery management system according to claim 14, wherein the control unit is further configured to determine the optimal resistance using the following Equation 2, where:

$R_{int}$ denotes the internal resistance,
$I_{chr}$ denotes the charge current, and
$R_{opt}$ denotes the optimal resistance:

$$R_{opt} = \frac{\{V_{ocv} + (R_{int} - R_{ref})I_{end} + R_{ref}I_{chr}\} - V_{ocv}}{I_{chr}} = \frac{(R_{int} - R_{ref})I_{end}}{I_{chr}} + R_{ref}. \quad \text{[Equation 2]}$$

16. The battery management system according to claim 10, wherein the control unit is further configured to determine an intermediate point closest to the end point among the plurality of intermediate points as the reference point.

17. A battery pack, comprising the battery management system according to claim 10.

18. A method for optimizing an internal resistance of a battery, the method comprising:

selecting a reference profile from among a plurality of voltage-current characteristic profiles based on a state of charge and temperature of the battery, each of the plurality of voltage-current characteristic profiles including a start point, an end point, and a plurality of intermediate points disposed between the start point and the end point, wherein the intermediate points of the reference profile are disposed above a straight line passing through the start point and the end point;

determining the internal resistance of the battery based on the start point and the end point;

setting one of the plurality of intermediate points as a reference point;

determining a reference resistance that is lower than the internal resistance based on the reference point and the end point; and determining an optimal resistance that is larger than the internal resistance based on the charge current, the internal resistance, the reference resistance, and a upper limit of charge current of the battery.

* * * * *